(12) United States Patent
Schexnayder

(10) Patent No.: US 10,530,916 B1
(45) Date of Patent: Jan. 7, 2020

(54) POP-OUT PHONE CASE ASSEMBLY

(71) Applicant: Rita Schexnayder, Sorrento, LA (US)

(72) Inventor: Rita Schexnayder, Sorrento, LA (US)

( * ) Notice: Subject to any disclaimer, the term of this patent is extended or adjusted under 35 U.S.C. 154(b) by 0 days.

(21) Appl. No.: 16/224,384

(22) Filed: Dec. 18, 2018

(51) Int. Cl.
*H04M 1/00* (2006.01)
*H04M 1/60* (2006.01)
*H04M 1/02* (2006.01)
*H05K 5/02* (2006.01)
*G06F 1/16* (2006.01)

(52) U.S. Cl.
CPC .......... *H04M 1/6041* (2013.01); *G06F 1/166* (2013.01); *H04M 1/0279* (2013.01); *H05K 5/0204* (2013.01); *H05K 5/0234* (2013.01)

(58) Field of Classification Search
CPC .......................... H04M 1/6041; H04M 1/0279
USPC ........................................................ 455/575.1
See application file for complete search history.

(56) References Cited

U.S. PATENT DOCUMENTS

| | | | | |
|---|---|---|---|---|
| 4,878,237 A | * | 10/1989 | Cianflone | B60R 11/0241 455/556.1 |
| 5,115,465 A | * | 5/1992 | Freer | H04M 1/05 379/447 |
| 5,503,313 A | * | 4/1996 | Wei | H04M 1/05 224/197 |
| 5,586,704 A | * | 12/1996 | Alexander | A45F 5/00 224/605 |
| 5,668,869 A | * | 9/1997 | Zinno | H04M 1/05 379/446 |
| D440,760 S | | 4/2001 | Joseph | |
| 6,246,764 B1 | * | 6/2001 | Owen | H04M 1/05 379/449 |
| 6,535,606 B2 | * | 3/2003 | Cox | H04M 1/05 379/449 |
| 9,686,391 B1 | * | 6/2017 | McCullough | H04M 1/05 |
| 10,027,788 B2 | * | 7/2018 | Pierce | F41G 1/02 |
| 10,218,831 B1 | * | 2/2019 | Caruba | H04M 1/04 |
| 2006/0011688 A1 | * | 1/2006 | Duncan | A45F 3/14 224/602 |
| 2006/0243771 A1 | * | 11/2006 | Davila | A45F 3/04 224/647 |
| 2012/0329534 A1 | * | 12/2012 | Barnett | F16M 11/10 455/575.8 |
| 2014/0367429 A1 | * | 12/2014 | Duran | B60R 11/0241 224/275 |

FOREIGN PATENT DOCUMENTS

| | | | |
|---|---|---|---|
| WO | WO2009064268 | 5/2009 | |
| WO | WO-2009064268 A1 * | 5/2009 | ............. A45C 11/00 |

* cited by examiner

*Primary Examiner* — April G Gonzales

(57) ABSTRACT

A pop-out phone case assembly for facilitating hands free use of a smart phone during a phone call includes a smart phone case that has a smart phone is removably positioned therein. A saddle unit is movably coupled to the smart phone case. The saddle unit is positionable in a deployed position having the saddle unit extending away from the smart phone case. Moreover, the saddle unit conforms to a curvature of a user's shoulder and spaces the smart phone case away from the user's shoulder. In this way the saddle unit facilitates the smart phone to be comfortably positioned between the user's ear and the user's shoulder for hands free use of the smart phone during a phone call. The saddle unit is positionable in a stored position having the saddle unit lying against the smart phone case.

6 Claims, 5 Drawing Sheets

POP-OUT PHONE CASE ASSEMBLY

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM

Not Applicable

STATEMENT REGARDING PRIOR DISCLOSURES BY THE INVENTOR OR JOINT INVENTOR

Not Applicable

BACKGROUND OF THE INVENTION

(1) Field of the Invention

(2) Description of Related Art Including Information Disclosed Under 37 CFR 1.97 and 1.98

The disclosure and prior art relates to phone case devices and more particularly pertains to a new phone case device for facilitating hands free use of a smart phone during a phone call.

BRIEF SUMMARY OF THE INVENTION

An embodiment of the disclosure meets the needs presented above by generally comprising a smart phone case having a smart phone removably positioned therein. A saddle unit is movably coupled to the smart phone case. The saddle unit is positionable in a deployed position having the saddle unit extending away from the smart phone case. Moreover, the saddle unit conforms to a curvature of a user's shoulder and spaces the smart phone case away from the user's shoulder. In this way the saddle unit facilitates the smart phone to be comfortably positioned between the user's ear and the user's shoulder for hands free use of the smart phone during a phone call. The saddle unit is positionable in a stored position having the saddle unit lying against the smart phone case.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein.

DETAILED DESCRIPTION OF THE INVENTION

Figure 1:
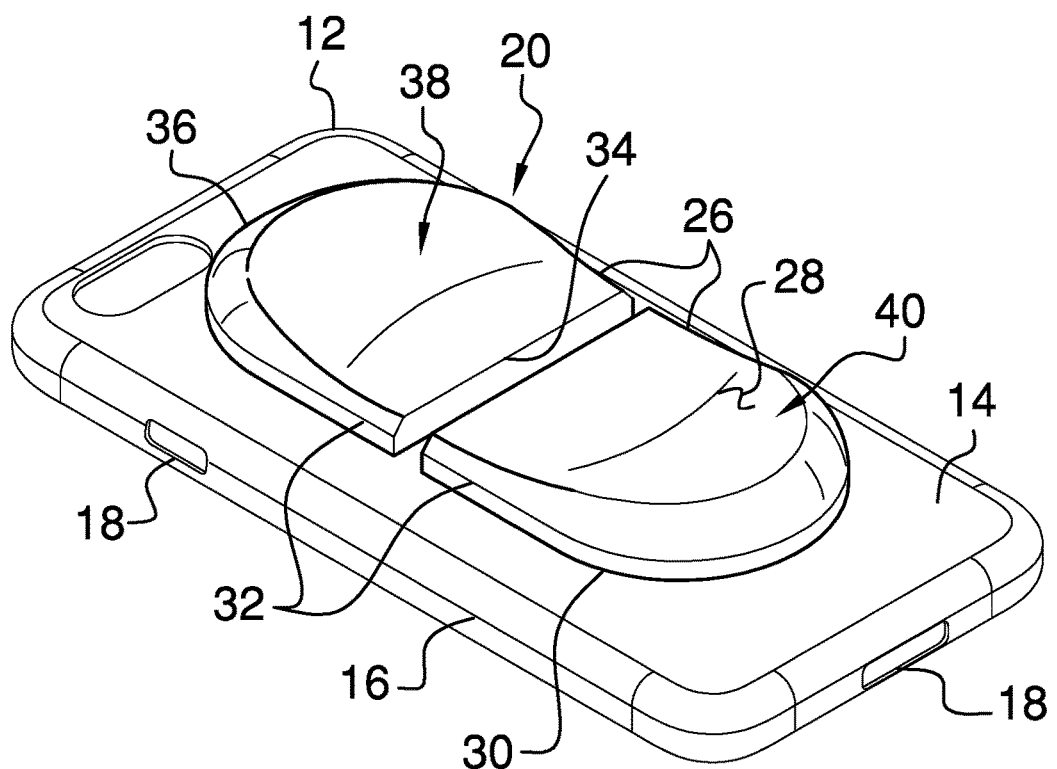
FIG. 1 is a perspective view of a pop-out phone case assembly according to an embodiment of the disclosure.
Figure 2:
FIG. 2 is a perspective in-use view of an embodiment of the disclosure.
Figure 3:
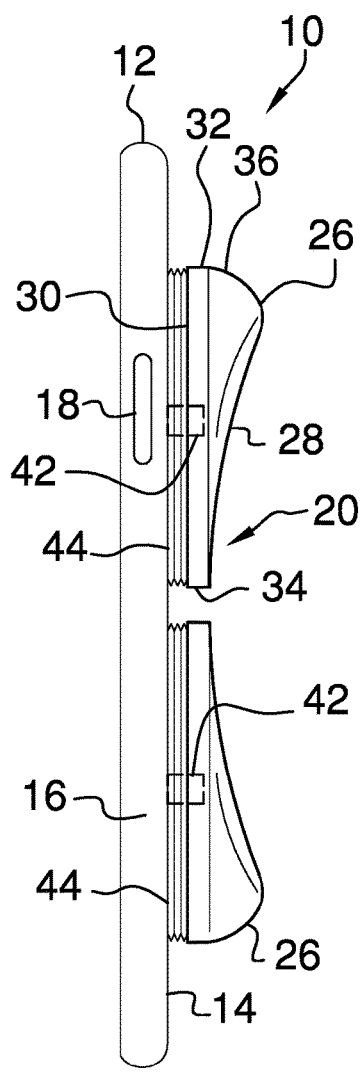
FIG. 3 is a left side view of an embodiment of the disclosure.
Figure 4:
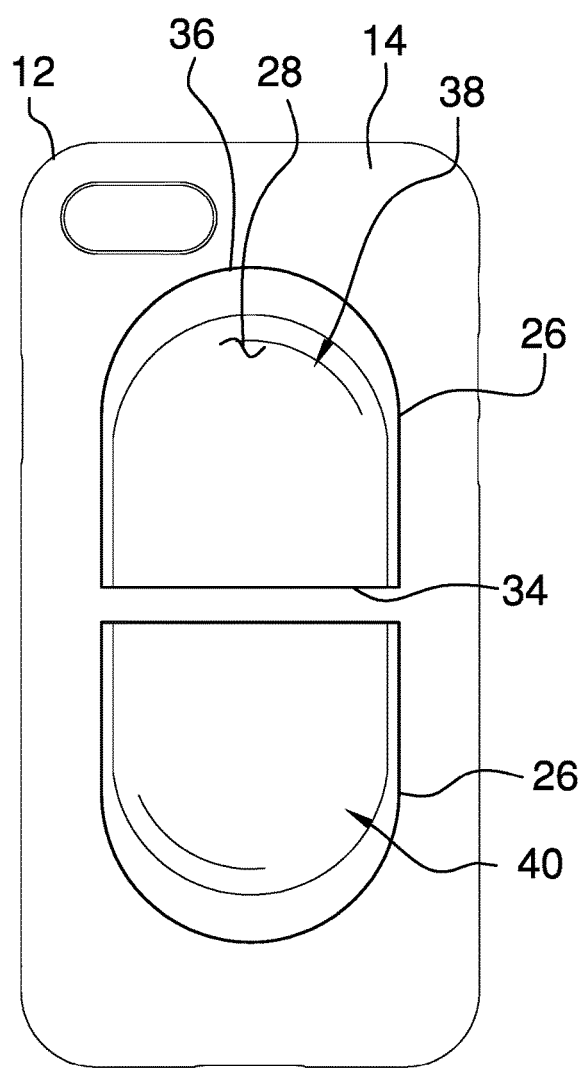
FIG. 4 is a top view of an embodiment of the disclosure.
Figure 5:
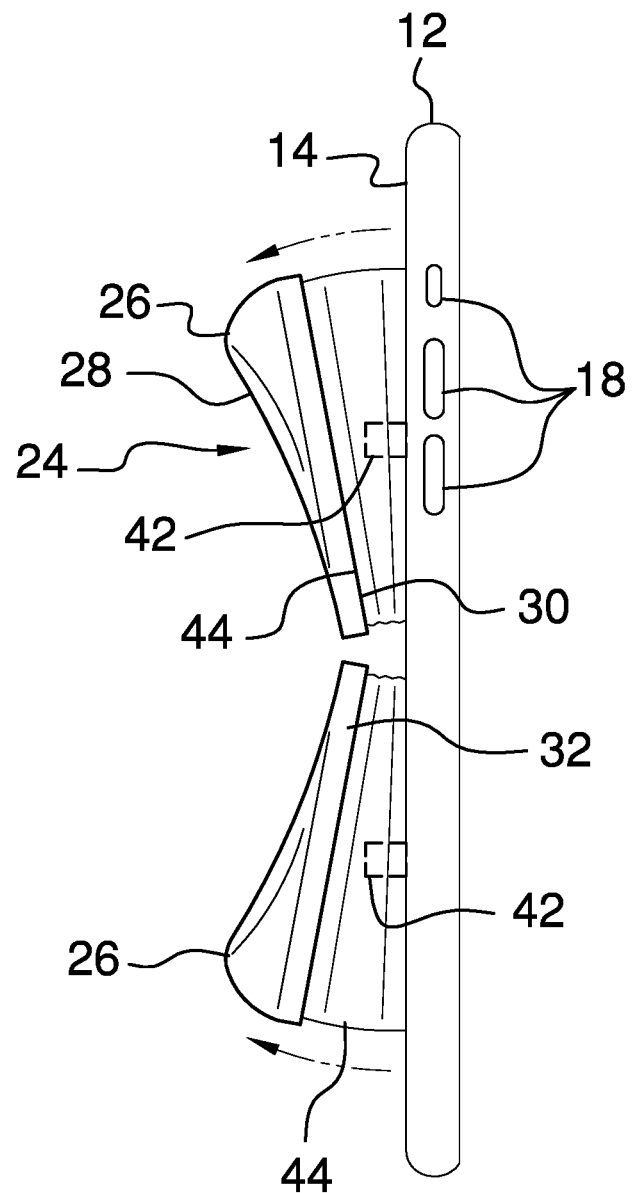
FIG. 5 is a right side view of an embodiment of the disclosure showing a pair of cushions in a deployed position.
Figure 6:
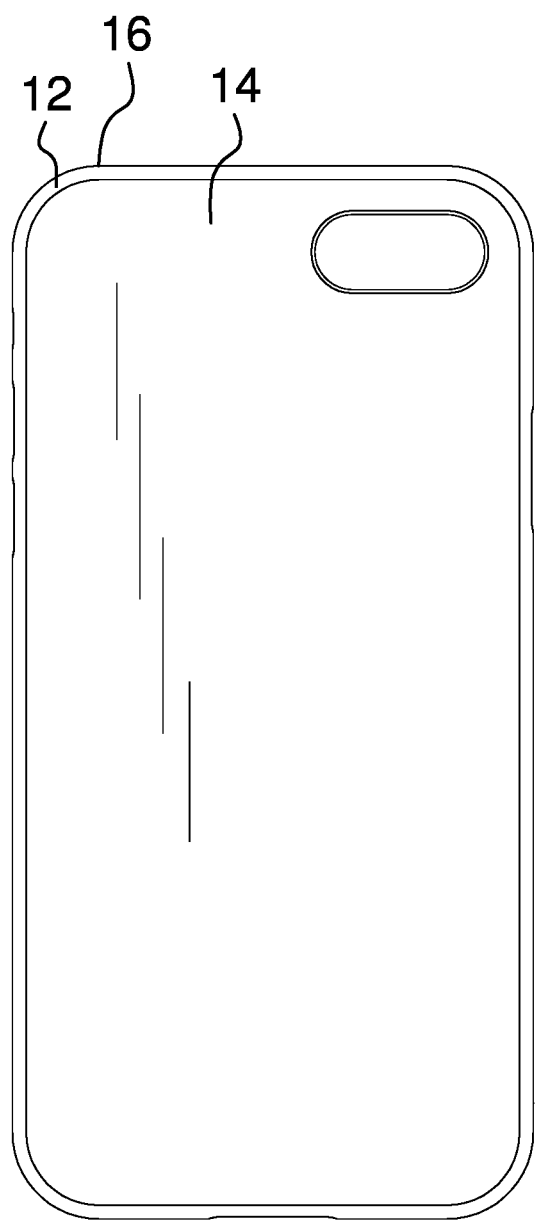
FIG. 6 is a bottom view of an embodiment of the disclosure.

With reference now to the drawings, and in particular to FIGS. 1 through 7 thereof, a new phone case device embodying the principles and concepts of an embodiment of the disclosure and generally designated by the reference numeral 10 will be described.

As best illustrated in FIGS. 1 through 7, the pop-out phone case assembly 10 generally comprises a smart phone case 12 that has a smart phone being removably positioned therein. The smart phone case 12 has a basal wall 14 and a perimeter wall 16 extending away therefrom, and the perimeter wall 16 surrounds the smart phone when the smart phone is positioned in the smart phone case 12. The smart phone case 12 is comprised of a rigid material for protecting the smart phone from impact damage. Moreover, the perimeter wall 16 has a plurality of control openings 18 each extending therethrough for manipulating control buttons on the smart phone when the smart phone is positioned in the smart phone case 12. The smart phone case 12 may be a smart phone case 12 of any conventional design.

A saddle unit 20 is provided and the saddle unit 20 is movably coupled to the smart phone case 12. The saddle unit 20 is positionable in a deployed position having the saddle unit 20 extending away from the smart phone case 12. Moreover, the saddle unit 20 conforms to a curvature of user's shoulder 22 and spaces the smart phone case 12 away from the user's shoulder 22 when the saddle unit 20 is positioned on the user's shoulder 22. In this way the saddle unit 20 facilitates the smart phone to be comfortably positioned between the user's ear 24 and the user's shoulder 22 for hands free use of the smart phone during a phone call. Additionally, the saddle unit 20 is positionable in a stored position has the saddle unit 20 lying against the smart phone case 12.

The saddle unit 20 comprises a pair of cushions 26 that each has a top surface 28, a bottom surface 30 and a perimeter edge 32 extending therebetween. The perimeter edge 32 of each of the cushions 26 has a front side 34 and a back side 36, and the top surface 28 of each of the cushions 26 curves upwardly between the front side 34 and the back side 36. The top surface 28 of each of the cushions 26 is exposed with respect to the basal wall 14 of the smart phone case 12 thereby facilitating the top surface 28 of each of the cushions 26 to abut the user's shoulder 22. Each of the cushions 26 is comprised of a resiliently compressible material for enhancing comfort on the user's shoulder 22.

The pair of cushions 26 includes a first cushion 38 and a second cushion 40. Each of the first 38 and second 40 cushions is oriented on the smart phone case 12 such that the front side 34 of the perimeter edge 32 of each of the first 38 and second 40 cushions is spaced apart from each other and is aligned with a center of the basal wall 14 of the smart phone case 12. Additionally, the top surface 28 of each of the first 38 and second 40 cushions slopes upwardly in opposite directions from each other.

A pair of engagements 42 is each coupled to the basal wall 14 of the smart phone case 12. Each of the engagements 42 is aligned with a respective one of the cushions 26 and the engagements 42 releasably engage the respective cushion 26 when the respective cushion 26 is urged into the stored position. The engagements 42 disengage the respective cushion 26 when the respective cushion 26 is depressed when the respective cushion 26 is in the stored position. Each of the engagements 42 may be a two position, releasable mechanical engagement of any conventional design.

Figure 7:
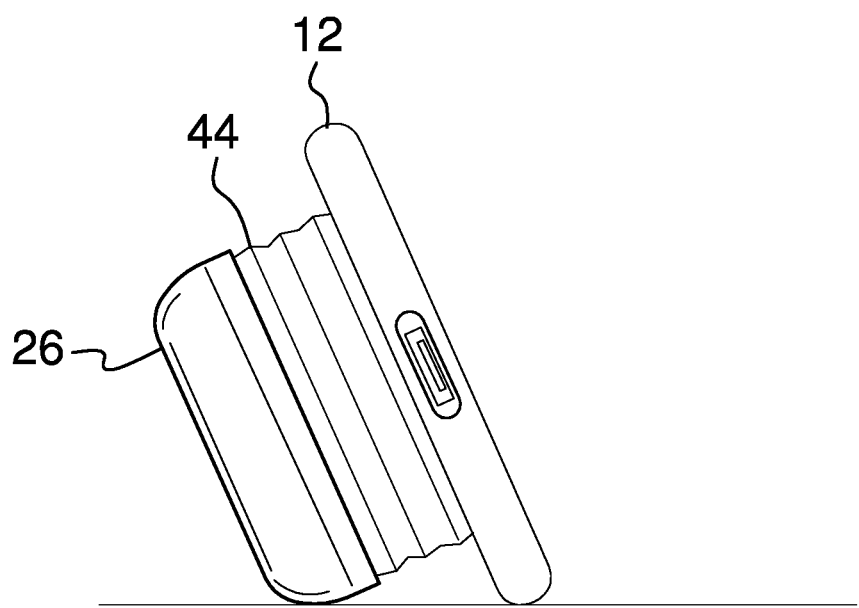
FIG. 7 is an end view of an embodiment of the disclosure.

A pair of biasing members 44 is each coupled between the basal wall 14 of the smart phone case 12 and the bottom surface 30 of a respective one of the cushions 26. The biasing members 44 are compressed when the cushions 26 are urged into the stored position. The biasing members 44 bias the respective cushion 26 into the deployed position when the engagements 42 disengage the respective cushion 26. Each of the biasing members 44 may be aligned with and be coextensive with the perimeter edge 32 of the respective cushion 26. As shown in FIG. 7, the smart phone case 12 can be rested against the cushions 26 on a support surface, such as a table or the like, when the cushions 26 are in the deployed position for retaining the smart phone case 12 in a landscape orientation.

In use, each of the cushions 26 is depressed when the cushions 26 are in the stored position such that the engagements 42 disengage the cushions 26 and the biasing members 44 bias the cushions 26 into the deployed position. Thus, each of the cushions 26 conforms to the curvature of the user's shoulder 22 when the smart phone case 12 is positioned between the user's head and the user's shoulder 22. In this way the smart phone in the smart phone case 12 can be employed for a phone call without being held in the user's hand. Each of the cushions 26 is depressed to urge each of the cushions 26 into the stored position, thereby facilitating the engagements 42 to engage the cushions 26 and thusly retain the cushions 26 in the stored position.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:

1. A pop-out phone case assembly being configured to comfortably position a smart phone between a user's shoulder and the user's head for talking on the smart phone, said assembly comprising:
    a smart phone case having a smart phone being removably positioned therein; and
    a saddle unit being movably coupled to said smart phone case, said saddle unit being positionable in a deployed position having said saddle unit extending away from said smart phone case, said saddle unit conforming to a curvature of user's shoulder and spacing said smart phone case away from the user's shoulder wherein said saddle unit is configured to facilitate the smart phone to be comfortably positioned between the user's ear and the user's shoulder for hands free use of the smart phone during a phone call, said saddle unit being positionable in a stored position having said saddle unit lying against said smart phone case, said saddle unit including a pair of cushions, each of said cushions having a top surface, a bottom surface and a perimeter edge extending therebetween, said perimeter edge of each of said cushions having a front side and a back side, said top surface of each of said cushions curving upwardly between said front side and said back side, said top surface of each of said cushions being exposed with respect to a basal wall of said smart phone case wherein said top surface of each of said cushions is configured to abut the user's shoulder.

2. The assembly according to claim 1, wherein said smart phone case has a basal wall and a perimeter wall extending away therefrom, said perimeter wall surrounding the smart phone when the smart phone is positioned in said smart phone case, said smart phone case being comprised of a rigid material for protecting the smart phone from impact damage, said perimeter wall having a plurality of control openings each extending therethrough for manipulating control buttons on the smart phone when the smart phone is positioned in said smart phone case.

3. The assembly according to claim 1, wherein said pair of cushions includes a first cushion and a second cushion, each of said first and second cushions being oriented on said smart phone case having said front side of said perimeter edge of each of said first and second cushions being spaced apart from each other and being aligned with a center of said basal wall of said smart phone case such that said top surface of each of said first and second cushions slopes upwardly in opposite directions from each other.

4. The assembly according to claim 1, further comprising a pair of engagements, each of said engagements being coupled to said basal wall of said smart phone case, each of said engagements being aligned with a respective one of said cushions, said engagements releasably engaging said respective cushion when said respective cushion is urged into said stored position, said engagements disengaging said respective cushion when said respective cushion is depressed when said respective cushion is in said stored position.

5. The assembly according to claim 4, further comprising a pair of biasing members, each of said biasing members being coupled between said basal wall of said smart phone case and said bottom surface of a respective one of said cushions, said biasing members being compressed when said cushions are urged into said stored position, said biasing members biasing said respective cushion into said deployed position when said engagements disengage said respective cushion.

6. A pop-out phone case assembly being configured to comfortably position a smart phone between a user's shoulder and the user's head for talking on the smart phone, said assembly comprising:

a smart phone case having a smart phone being removably positioned therein, said smart phone case having a basal wall and a perimeter wall extending away therefrom, said perimeter wall surrounding the smart phone when the smart phone is positioned in said smart phone case, said smart phone case being comprised of a rigid material for protecting the smart phone from impact damage, said perimeter wall having a plurality of control openings each extending therethrough for manipulating control buttons on the smart phone when the smart phone is positioned in said smart phone case; and a saddle unit being movably coupled to said smart phone case, said saddle unit being positionable in a deployed position having said saddle unit extending away from said smart phone case, said saddle unit conforming to a curvature of user's shoulder and spacing said smart phone case away from the user's shoulder wherein said saddle unit is configured to facilitate the smart phone to be comfortably positioned between the user's ear and the user's shoulder for hands free use of the smart phone during a phone call, said saddle unit being positionable in a stored position having said saddle unit lying against said smart phone case, said saddle unit comprising:

a pair of cushions, each of said cushions having a top surface, a bottom surface and a perimeter edge extending therebetween, said perimeter edge of each of said cushions having a front side and a back side, said top surface of each of said cushions curving upwardly between said front side and said back side, said top surface of each of said cushions being exposed with respect to said basal wall of said smart phone case wherein said top surface of each of said cushions is configured to abut the user's shoulder, said pair of cushions including a first cushion and a second cushion, each of said first and second cushions being oriented on said smart phone case having said front side of said perimeter edge of each of said first and second cushions being spaced apart from each other and being aligned with a center of said basal wall of said smart phone case such that said top surface of each of said first and second cushions slopes upwardly in opposite directions from each other;

a pair of engagements, each of said engagements being coupled to said basal wall of said smart phone case, each of said engagements being aligned with a respective one of said cushions, said engagements releasably engaging said respective cushion when said respective cushion is urged into said stored position, said engagements disengaging said respective cushion when said respective cushion is depressed when said respective cushion is in said stored position; and a pair of biasing members, each of said biasing members being coupled between said basal wall of said smart phone case and said bottom surface of a respective one of said cushions, said biasing members being compressed when said cushions are urged into said stored position, said biasing members biasing said respective cushion into said deployed position when said engagements disengage said respective cushion.

\* \* \* \* \*